(12) United States Patent
Yang et al.

(10) Patent No.: US 9,349,822 B2
(45) Date of Patent: May 24, 2016

(54) SEMICONDUCTOR DEVICE AND METHOD FOR FABRICATING THE SAME

(71) Applicant: UNITED MICROELECTRONICS CORP., Hsin-Chu (TW)

(72) Inventors: Chih-Wei Yang, Kaohsiung (TW); Yu-Feng Liu, Tainan (TW); Jian-Cun Ke, Tainan (TW); Chia-Fu Hsu, Tainan (TW); En-Chiuan Liou, Tainan (TW); Ssu-I Fu, Kaohsiung (TW); Chi-Mao Hsu, Tainan (TW); Nien-Ting Ho, Tainan (TW); Yu-Ru Yang, Hsinchu County (TW); Yu-Ping Wang, Taoyuan County (TW); Chien-Ming Lai, Tainan (TW); Yi-Wen Chen, Tainan (TW); Yu-Ting Tseng, Tainan (TW); Ya-Huei Tsai, Tainan (TW); Chien-Chung Huang, Tainan (TW); Tsung-Yin Hsieh, Tainan (TW); Hung-Yi Wu, Keelung (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/543,914

(22) Filed: Nov. 18, 2014

(65) Prior Publication Data

US 2016/0104786 A1 Apr. 14, 2016

(30) Foreign Application Priority Data

Oct. 13, 2014 (TW) .............................. 103135423 A

(51) Int. Cl.
*H01L 29/49* (2006.01)
*H01L 27/088* (2006.01)
*H01L 21/8234* (2006.01)
*H01L 21/28* (2006.01)
*H01L 21/321* (2006.01)
*H01L 27/092* (2006.01)

(52) U.S. Cl.
CPC ...... *H01L 29/4966* (2013.01); *H01L 21/28088* (2013.01); *H01L 21/32115* (2013.01); *H01L 21/82345* (2013.01); *H01L 27/088* (2013.01); *H01L 27/0922* (2013.01)

(58) Field of Classification Search
CPC .............. H01L 21/822345; H01L 21/823456; H01L 21/823842; H01L 29/49; H01L 29/4958; H01L 29/7455; H01L 29/7831
See application file for complete search history.

(56) References Cited

U.S. PATENT DOCUMENTS

| 6,130,123 | A | 10/2000 | Liang et al. | |
|---|---|---|---|---|
| 7,037,830 | B1 | 5/2006 | Rumer et al. | |
| 7,682,891 | B2 | 3/2010 | Lavoie et al. | |
| 2013/0299922 | A1* | 11/2013 | Choi ................. | H01L 21/82345 257/412 |
| 2014/0051225 | A1* | 2/2014 | Chang ............. | H01L 21/823842 438/404 |

* cited by examiner

*Primary Examiner* — Armando Rodriguez
(74) *Attorney, Agent, or Firm* — Winston Hsu; Scott Margo

(57) ABSTRACT

A method for fabricating semiconductor device is disclosed. The method includes the steps of: providing a substrate having an interlayer dielectric (ILD) layer thereon; forming a first recess, a second recess, and a third recess in the ILD layer; forming a material layer on the ILD layer and in the first recess, the second recess, and the third recess; performing a first treatment on the material layer in the first recess; and performing a second treatment on the material layer in the first recess and second recess.

17 Claims, 4 Drawing Sheets

SEMICONDUCTOR DEVICE AND METHOD FOR FABRICATING THE SAME

BACKGROUND OF THE INVENTION

1. Field of the Invention

The invention relates to a semiconductor device, and more particularly, to a semiconductor device of using gate structure having different orientation ratio for achieving different threshold voltages.

2. Description of the Prior Art

In current semiconductor industry, polysilicon has been widely used as a gap-filling material for fabricating gate electrode of metal-oxide-semiconductor (MOS) transistors. However, the conventional polysilicon gate also faced problems such as inferior performance due to boron penetration and unavoidable depletion effect which increases equivalent thickness of gate dielectric layer, reduces gate capacitance, and worsens driving force of the devices. In replacing polysilicon gates, work function metals have been developed to serve as a control electrode working in conjunction with high-K gate dielectric layers.

Typically, threshold voltage in conventional planar metal gate transistors is adjusted by the means of ion implantation. With the trend in the industry being towards scaling down the size of the metal oxide semiconductor transistors (MOS), three-dimensional or non-planar transistor technology, such as fin field effect transistor technology (FinFET) has been developed to replace planar MOS transistors. Nevertheless, threshold voltages in current FinFET cannot be easily adjusted by using ion implantation. Hence, how to resolve this issue in today's FinFET architecture has become an important task in this field.

SUMMARY OF THE INVENTION

According to a preferred embodiment of the present invention, a method for fabricating semiconductor device is disclosed. The method includes the steps of: providing a substrate having an interlayer dielectric (ILD) layer thereon; forming a first recess, a second recess, and a third recess in the ILD layer; forming a material layer on the ILD layer and in the first recess, the second recess, and the third recess; performing a first treatment on the material layer in the first recess; and performing a second treatment on the material layer in the first recess and second recess.

According to another aspect of the present invention, a method for fabricating semiconductor device is disclosed. The method includes the steps of: providing a substrate having an interlayer dielectric (ILD) layer thereon; forming a first recess, a second recess, and a third recess in the ILD layer; and forming a first work function layer, a second work function layer, and a third work function layer in the first recess, the second recess, and the third recess, in which the first work function layer, the second work function layer, and the third work function layer are formed by different deposition temperature.

According to another aspect of the present invention, a semiconductor device is disclosed. The semiconductor device includes: a substrate; and a first gate structure, a second gate structure, and a third gate structure on the substrate and an interlayer dielectric (ILD) layer around the first gate structure, the second gate structure, and the third gate structure, in which the orientation ratio of the first gate structure, the second gate structure, and the third gate structure are different from each other.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
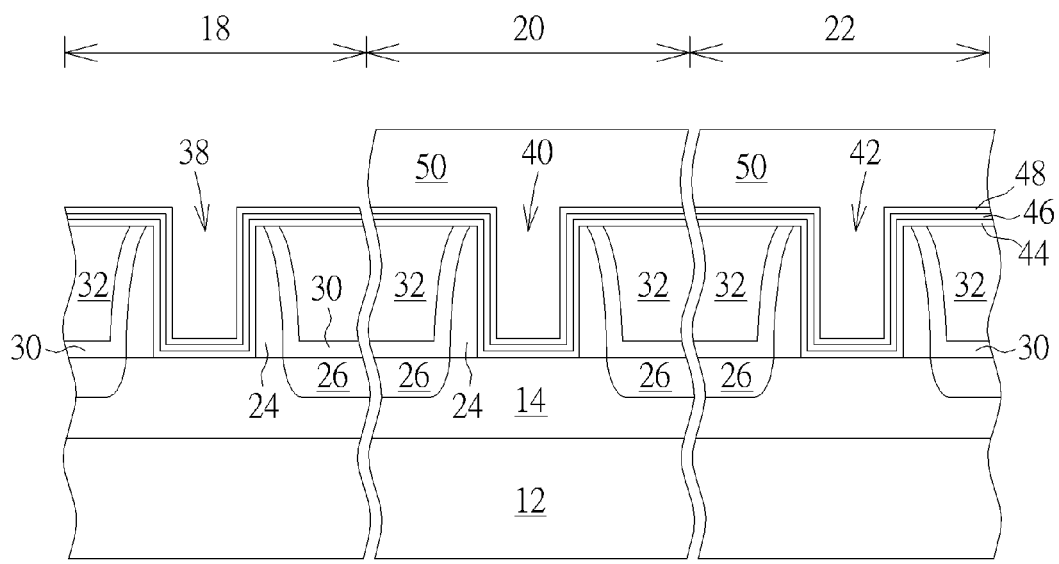
FIGS. 1-3 illustrate a method for fabricating semiconductor device according to a preferred embodiment of the present invention.
Figure 2:
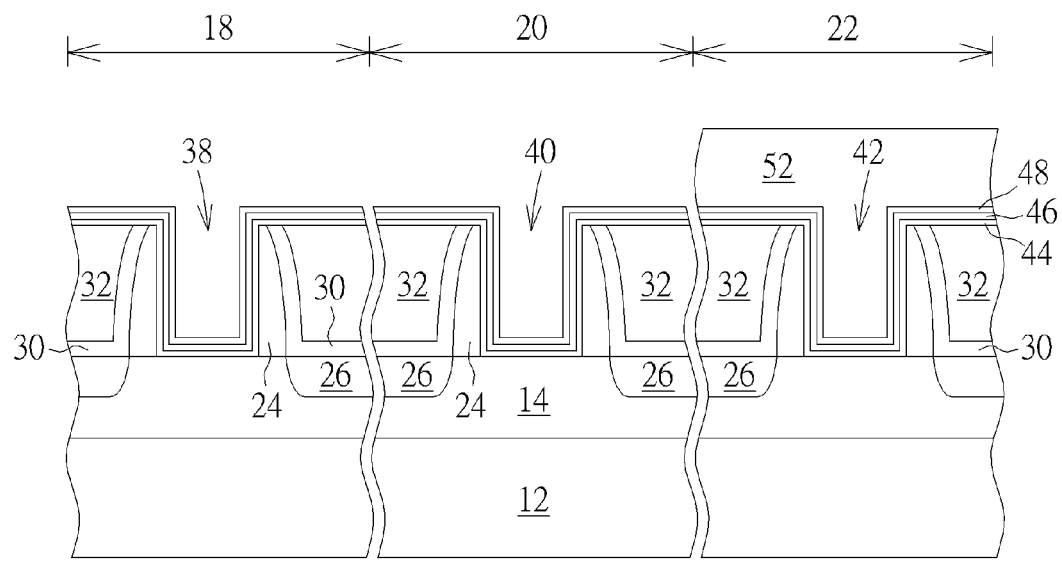
Figure 3:
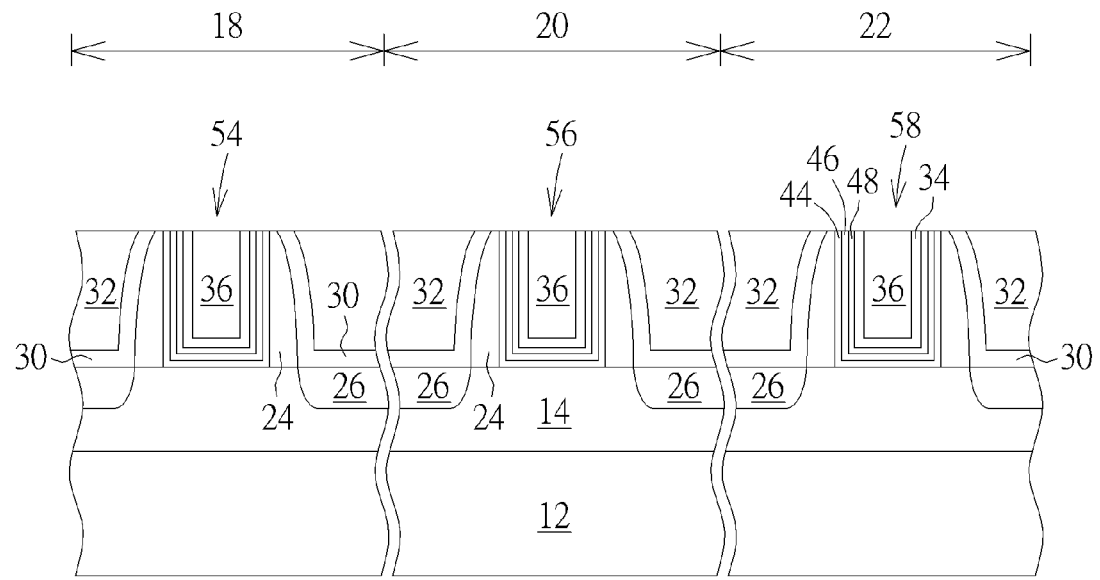

Referring to FIGS. 1-3, FIGS. 1-3 illustrate a method for fabricating semiconductor device according to a preferred embodiment of the present invention. As shown in FIG. 1, a substrate 12, such as a silicon substrate or silicon-on-insulator (SOI) substrate is provided, and three transistor regions 18, 20, 22 are defined on the substrate. The three transistor regions 18, 20, 22 are preferably composed of same conductive type, such as PMOS regions or NMOS regions, and the transistor regions 18, 20, 22 are utilized for fabricating gate structures having different threshold voltages afterwards. At least a first fin-shaped structure 14 and an insulating layer (not shown) are formed on the substrate 12, in which the bottom of the fin-shapes structure 14 is preferably enclosed by the insulating layer, such as silicon oxide to form a shallow trench isolation (STI).

The formation of the fin-shaped structure 14 could be accomplished by first forming a patterned mask (now shown) on the substrate, 12, and an etching process is performed to transfer the pattern of the patterned mask to the substrate 12. Next, depending on the structural difference of a tri-gate transistor or dual-gate fin-shaped transistor being fabricated, the patterned mask could be stripped selectively or retained, and deposition, chemical mechanical polishing (CMP), and etching back processes are carried out to form an insulating layer surrounding the bottom of the fin-shaped structure 14. Alternatively, the formation of the fin-shaped structure 14 could also be accomplished by first forming a patterned hard mask (not shown) on the substrate 12, and then performing an epitaxial process on the exposed substrate 12 through the patterned hard mask to grow a semiconductor layer. This semiconductor layer could then be used as the corresponding fin-shaped structure 14. In another fashion, the patterned hard mask could be removed selectively or retained, and deposition, CMP, and then etching back could be used to form an insulating layer to surround the bottom of the fin-shaped structure 14. Moreover, if the substrate 12 were a SOI substrate, a patterned mask could be used to etch a semiconductor layer on the substrate until reaching a bottom oxide layer underneath the semiconductor layer to form the corresponding fin-shaped structure. If this means is chosen the aforementioned steps for fabricating the insulating layer could be eliminated.

Next, a metal gate fabrication process could be conducted to form three metal gates on the substrate 12, in which the fabrication of the metal gates could be accomplished by a gate first process, a high-k first approach from gate last process, or a high-k last approach from gate last process. Since this embodiment pertains to a high-k last approach, three dummy gates (not shown) composed of interfacial layer selected from the group consisting of $SiO_2$, SiN, and SiON and polysilicon material could be first formed on the fin-shaped structure 14 and the insulating layer, and liner, lightly doped drain (LDD) (not shown), and spacer 24 are formed adjacent to the dummy gates. A source/drain region 26 and epitaxial layer (not shown) are then formed in the fin-shaped structure 14 and/or substrate 12 adjacent to two sides of the spacer 24, a contact etch stop layer (CESL) 30 is formed on the dummy gates, and an interlayer dielectric (ILD) layer (not shown) composed of tetraethyl orthosilicate (TEOS) is formed on the CESL 30.

Next, part of the ILD layer 32 and CESL 30 are planarized and a selective dry etching or wet etching process is conducted by using etchants including ammonium hydroxide ($NH_4OH$) or tetramethylammonium hydroxide (TMAH) to remove the polysilicon layer from dummy gates for forming three recesses 38, 40, 42 in the ILD layer 32.

Next, the interfacial layer could be remove selectively and re-grown, and a high-k dielectric layer 44, a bottom barrier metal (BBM) layer 46, and a material layer 48 are formed sequentially on the ILD layer 32 to fill into the recesses 38, 40, 42.

In this embodiment, the high-k dielectric layer 44 is preferably selected from dielectric materials having dielectric constant (k value) larger than 4. For instance, the high-k dielectric layer 44 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof. The BBM layer 46 could be a single-layered structure or a double-layered structure, and is preferably composed of TiN and/or TaN, but not limited thereto.

The material layer 48 of this embodiment is preferably a material layer formed prior to the formation of work function layer, such as a BBM layer composed of TaN or TiN. Nevertheless, it should be noted that despite the material layer 48 is composed of a BBM layer in this embodiment, the material layer 48 could also be composed of a work function layer directly depending on the demand of the product, which is also within the scope of the present invention.

If the material layer 48 were to be a work function layer, various compositions could be chosen for tuning the work function of the metal gate so that the device could be adapted in an NMOS or a PMOS transistor. For an NMOS transistor, the work function layer having a work function ranging between 3.9 eV and 4.3 eV may include titanium aluminide (TiAl), zirconium aluminide (ZrAl), tungsten aluminide (WAl), tantalum aluminide (TaAl), hafniumaluminide (HfAl), or titanium aluminum carbide (TiAlC), but is not limited thereto. For a PMOS transistor, the work function layer having a work function ranging between 4.8 eV and 5.2 eV may include titanium nitride (TiN), tantalum nitride (TaN), tantalum carbide (TaC), but is not limited thereto.

Next, a patterned hard mask, such as a patterned resist 50 is formed on the transistor regions 20 and 22, and the patterned resist 50 is used as mask to perform a treatment on the material layer 48 exposed in the recess 38 for altering the surface energy of the material layer 48 so that the work function layer grown on the material layer 48 thereafter could have different orientation ratio. In this embodiment, the treatment process could include using gas to carry out a plasma bombardment on the material layer 48, in which the gas utilized in the plasma bombardment is selected from the group consisting of ammonia, hydrogen, and nitrogen.

Next, as shown in FIG. 2, the patterned resist 50 is stripped, another patterned resist 52 is formed to cover the transistor region 22, and another treatment is conducted thereafter on the material layer 48 exposed in the recesses 38 and 40 by using the patterned resist 52 as mask. The parameters of the treatment, including gas content and amount of energy used could be the same as the ones used in the previous treatment process, but not limited thereto.

Next, as shown in FIG. 3, the patterned resist 52 is stripped, a work function layer 34 and a low resistance metal layer 36 are formed sequentially on the material layer 48, and a planarizing process is conducted to form three gate structures 54, 56, 58. It should be noted that another barrier layer (not shown) could be formed between the work function layer 34 and low resistance metal layer 36, in which the barrier layer could be selected from the group consisting of Ti, TiN, Ta, and TaN. The low resistance metal layer 36 could be selected from the group consisting of Cu, Al, W, TiAl, and CoWP.

According to a preferred embodiment of the present invention, the gate structures 54, 56, 58 are composed of same conductive type, such as all being n-type gates or all being p-type gates. Since the material layer 48 within the recess 38 has been processed twice by two treatment processes, the material layer 48 within the recess 40 has been processes once by one single treatment process, and the material layer 48 within the recess 42 has not been processed by any treatment process, the work function layer 34 formed within each of the recesses 38, 40, 42 would reveal different orientation ratio so that each of the gate structures 54, 56, 58 could have different threshold voltages. For instance, the gate structure 54 being processed by two treatment processes becomes a low threshold voltage (LVT) gate, the gate structure 56 being processed by one treatment process becomes a standard threshold voltage (SVT) gate, and the gate structure 58 not being process by any treatment process becomes a high threshold voltage (HVT) gate.

Figure 4:
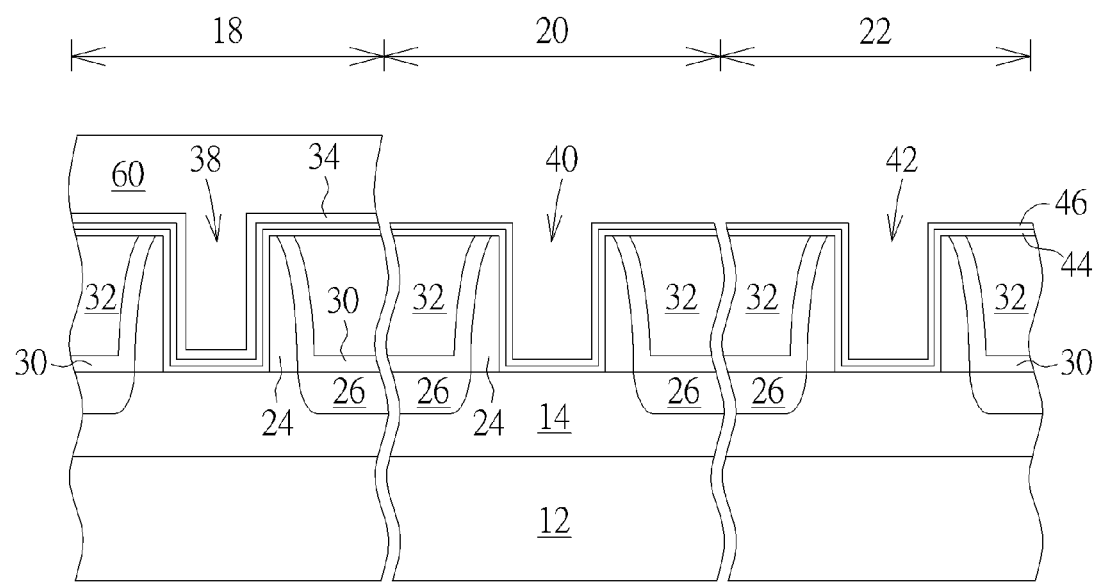
FIGS. 4-6 illustrate a method for fabricating semiconductor device according to another embodiment of the present invention.
Figure 5:
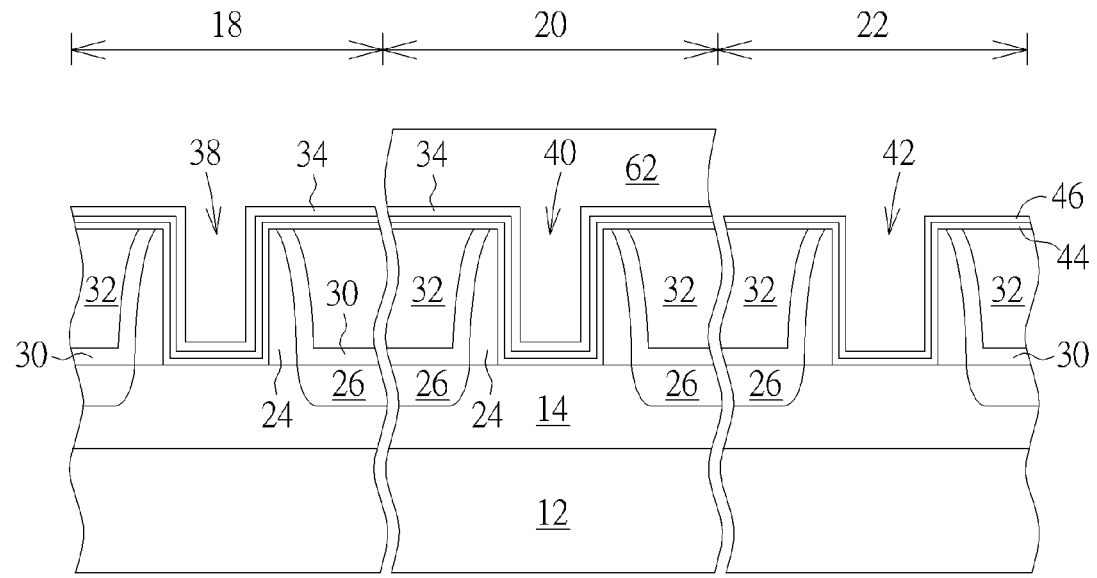
Figure 6:
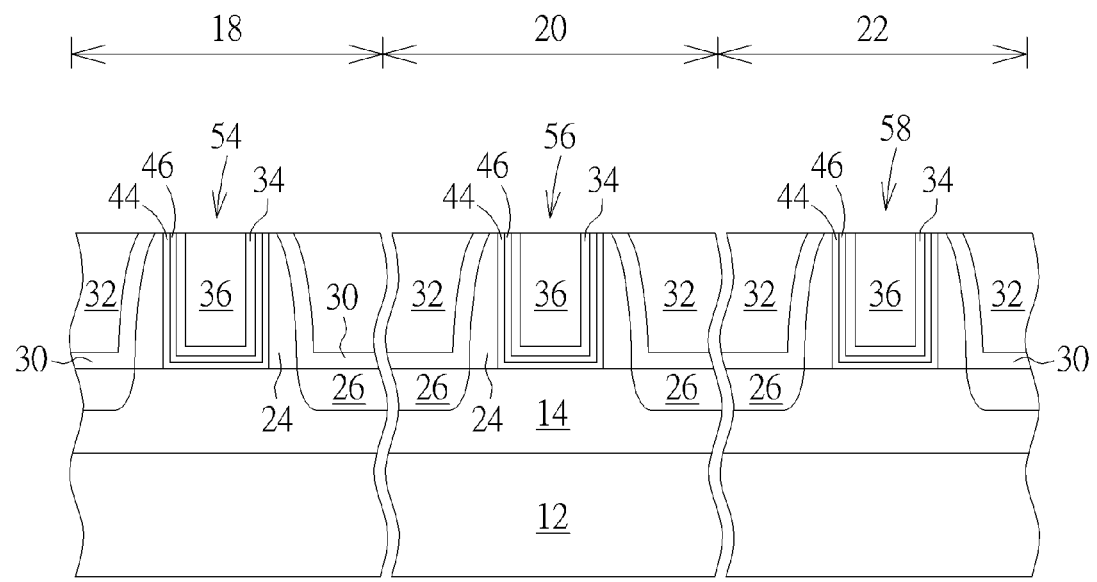

Referring to FIGS. 4-6, FIGS. 4-6 illustrate a method for fabricating semiconductor device according to another embodiment of the present invention. As shown in FIG. 4, a substrate 12, such as a silicon substrate or silicon-on-insulator (SOI) substrate is provided, and three transistor regions 18, 20, 22 are defined on the substrate. The three transistor regions 18, 20, 22 are preferably composed of same conductive type, such as PMOS regions or NMOS regions, and the transistor regions 18, 20, 22 are utilized for fabricating gate structures having different threshold voltages afterwards. Three dummy gates (not shown) could then be formed on the substrate 12 similar to FIG. 1, transistor elements such as source/drain region 26 is formed in the substrate 12, an ILD layer 32 is formed to cover the dummy gates, and polysilicon material in the dummy gates are removed to form three recesses 38, 40, 42 in the transistor regions 18, 20, 22.

Next, a high-k dielectric layer 44 and a BBM layer 46 are formed on the ILD layer 32 to fill into the recesses 38, 40, 42. The composition of the high-k dielectric layer 44 and BBM layer 46 could be the same as the ones disclosed in the aforementioned embodiment, and the details of which are not explained herein for the sake of brevity.

Next, a work function layer (not shown) is formed on the transistor regions 18, 20, 22, a patterned mask, such as a patterned resist 60 is covered on the transistor region 18, and the patterned resist 60 is used as mask to remove part of the work function layer in the transistor regions 20, 22 for forming a work function layer 34 in the recess 38 of the transistor region 18.

Next, as shown in FIG. 5, after stripping the patterned resist 60 and forming another work function layer (not shown) in the transistor regions 18, 20, 22, another patterned resist 62 is formed on the transistor region 20, and the patterned resist 62 is used as mask to remove part of the work function layer in the transistor regions 18 and 22 for forming a work function layer 34 in the recess 40 of the transistor region 20.

Next, as shown in FIG. 6, aforementioned steps are repeated by stripping the patterned resist 62, forming a work function layer (not shown) on the transistor regions 18, 20, 22, forming another patterned resist (not shown) on the transistor region 22, and then using the patterned resist as mask to remove part of the work function layer in the transistor regions 18, 20 for forming another work function layer 34 in the recess 42 of the transistor region 22. After stripping the patterned resist from the transistor region 22, a low resistance metal layer 36 is formed on the work function layer 34 and a planarizing process is conducted to form three gate structures 54, 56, 58.

It should be noted that the gate structures 54, 56, 58 of this embodiment are preferably composed of same conductive type, such as all being n-type gates or all being p-type gates. Moreover, the deposition processes conducted in FIGS. 4-6 are preferably accomplished by using different temperature with corresponding bias voltages to form work function layers consisting of same material while demonstrating different threshold voltages. For instance, the work function layers 34 in recesses 38, 40, 42 are formed by different deposition temperatures respectively, and the work function layers 34 in each of the recesses 38, 40, 42 preferably have different orientation so that each of the gate structures 54, 56, 58 would have different threshold voltage. For fabricating p-type gate structures, gate structures fabricated by lower deposition temperature preferably constitute a low threshold voltage (LVT) gate, whereas gate structures fabricated by higher deposition temperatures preferably constitute a standard threshold voltage (SVT) gate or a high threshold voltage (HVT) gate.

Figure 7:
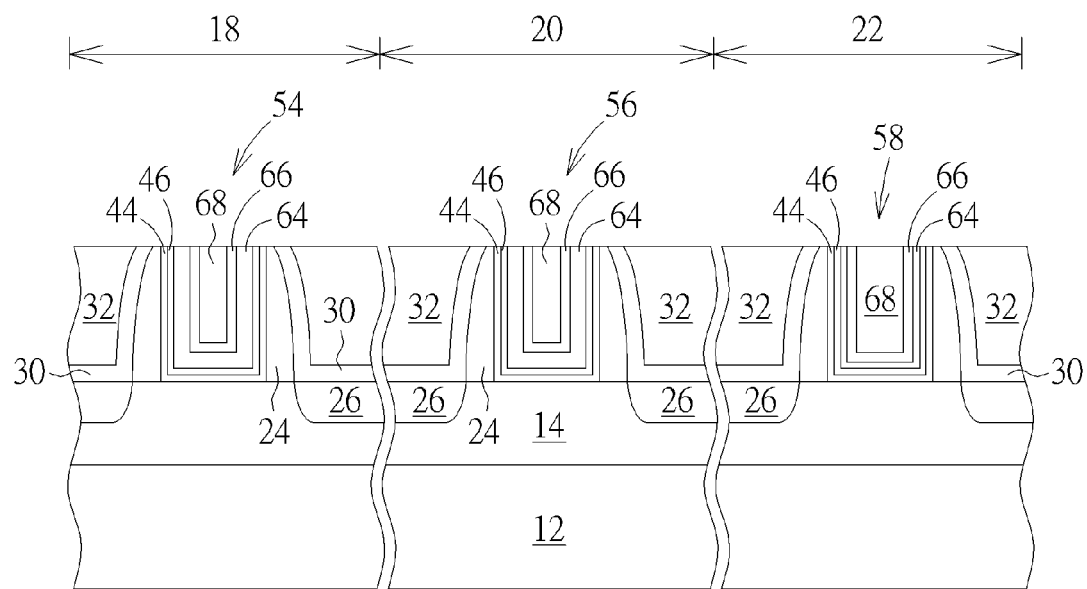
FIG. 7 illustrates a method for fabricating semiconductor device according to another embodiment of the present invention.

Referring to FIG. 7, FIG. 7 illustrates a method for fabricating semiconductor device according to another embodiment of the present invention. As shown in FIG. 7, three dummy gates (not shown) are formed on a substrate 12 similar to FIG. 1, transistor elements such as source/drain region 226 is formed in the substrate 12, an ILD layer 32 is covered on the dummy gates, and polysilicon material are removed from the dummy gates to form three recesses (not shown) in transistor regions 18, 20, 22. It should be noted that the transistor regions 18 and 20 of this embodiment are composed of same conductive type while the transistor region 22 is composed of different conductive type. For instance, the transistor regions 18 and 20 could be PMOS region while the transistor region 22 could be a NMOS region.

Next, a high-k dielectric layer 44 and a BBM layer 46 are formed on the ILD layer 32 to fill into the recesses 38, 40, 42. The composition of the high-k dielectric layer 44 and BBM layer 46 could be the same as the ones disclosed in the aforementioned embodiment, and the details of which are not explained herein for the sake of brevity.

Next, p-type work function layers of different thickness are formed in the recesses of the transistor regions 18, 20, 22. For instance, a first p-type work function layer (not shown) is formed on transistor regions 18, 20, 22, and a patterned mask (not shown) such as a patterned resist is covered on the transistor regions 18 and 20. An etching process is then conducted by using the patterned resist as mask to remove the p-type work function layer from the transistor region 22 so that the remaining first p-type work function layer (not shown) is formed on the transistor regions 18, 20.

After stripping the patterned resist, a second p-type work function layer (not shown) is formed in the recesses of the transistor regions 18, 20, 22. This forms a thicker p-type work function layer 64 on the transistor regions 18 and 20 and a thinner p-type work function layer 64 on the transistor region 22. A n-type work function layer 66 and a low resistance metal layer 68 are then deposited sequentially on the p-type work function layer 64 of the transistor regions 18, 20, 22, and a planarizing process is conducted to form three gate structures 54, 56, 58.

It should be noted that the p-type work function layer 64 deposited on the transistor region 22 (or NMOS region) is preferably thinner than the p-type work function layer 64 deposited on the transistor regions 18 and 20 (or PMOS regions), or the p-type work function layer 64 of the PMOS regions are thicker than the p-type work function layer 64 of the NMOS region. By forming p-type work function layer of different thickness in the two transistor regions respectively, it would be desirable to allow the gate structures 54 and 56 of PMOS region and the gate structure 58 of NMOS region to have different threshold voltage. Moreover, the p-type work function layer 64 of the PMOS region and the p-type work function layer 64 of the NMOS region could also be composed of same material or different material, which is also within the scope of the present invention.

Overall, the present invention preferably performs a treatment process on a work function layer directly or a material layer formed prior to work function layer while fabricating three or more gate structures. This creates gate structures with different orientation ratio so that threshold voltage of each of the gate structures would be different. According to a preferred embodiment of the present invention, the treatment process conducted on the work function layer or the material layer formed prior to the work function layer include plasma bombardment or deposition temperature adjustment. Alternatively, gate structures having different threshold voltage could also be achieved by adjusting the thickness of work function layer in each transistor region.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
   providing a substrate having an interlayer dielectric (ILD) layer thereon;
   forming a first recess, a second recess, and a third recess in the ILD layer;
   forming a material layer on the ILD layer and in the first recess, the second recess, and the third recess;
   performing a first treatment on the material layer in the first recess but not on the material layer in the second recess and in the third recess; and
   performing a second treatment on the material layer in the first recess and second recess.

2. The method of claim 1, wherein the material layer comprises a work function layer.

3. The method of claim 1, further comprises forming a work function layer after forming the material layer.

4. The method of claim 3, further comprising:
   forming a low resistance metal layer on the work function layer; and planarizing the low resistance layer and the work function layer for forming three gate structures.

5. The method of claim 4, wherein the three gate structures comprise same conductive type.

6. The method of claim 4, wherein the work function layer of the three gate structures comprise different orientation ratio.

7. The method of claim 4, wherein the three gate structures comprise different threshold voltages (Vt).

8. A method for fabricating semiconductor device, comprising:
   providing a substrate having an interlayer dielectric (ILD) layer thereon;
   forming a first recess, a second recess, and a third recess in the ILD layer; and
   forming a first work function layer, a second work function layer, and a third work function layer in the first recess, the second recess, and the third recess, wherein the first work function layer, the second work function layer, and the third work function layer are formed by different deposition temperature.

9. The method of claim 8, further comprising:
   forming a low resistance metal layer on the first work function layer, the second work function layer, and the third work function layer; and
   planarizing the low resistance layer and the first work function layer, the second work function layer, and the third work function layer for forming three gate structures.

10. The method of claim 9, wherein the three gate structures comprise same conductive type.

11. The method of claim 9, wherein the first work function layer, the second work function layer, and the third work function layer of the three gate structures comprise different orientation ratio.

12. The method of claim 9, wherein the three gate structures comprise different threshold voltages (Vt).

13. A semiconductor device, comprising:
   a substrate; and
   a first gate structure, a second gate structure, and a third gate structure on the substrate and an interlayer dielectric (ILD) layer around the first gate structure, the second gate structure, and the third gate structure, wherein the first gate structure comprises a first work function layer, the second gate structure comprises a second work function layer, the third gate structure comprises a third work function layer, and the first work function layer, the second work function layer, and the third work function layer comprise different orientation ratio; and
   a fourth work function layer on the first work function layer, the second work function layer, and the third work function layer.

14. The semiconductor device of claim 13, wherein the first gate structure, the second gate structure, and the third gate structure comprise different threshold voltage (Vt).

15. A semiconductor device, comprising:
   a substrate; and
   a first gate structure, a second gate structure, and a third gate structure on the substrate and an interlayer dielectric (ILD) layer around the first gate structure, the second gate structure, and the third gate structure, wherein the orientation ratio of the first gate structure, the second gate structure, and the third gate structure are different from each other, wherein the first gate structure comprises a first work function layer, the second gate structure comprises a second work function layer, and the first work function layer and the second work function layer comprise different thickness, wherein the first work function layer comprises a p-type work function layer, the second work function layer comprises an n-type work function layer, and the thickness of the n-type work function layer is lower than the thickness of the p-type work function layer.

16. The semiconductor device of claim 15, wherein the first work function layer and the second work function layer comprise same conductive type.

17. The semiconductor device of claim 16, wherein the first work function layer and the second work function layer comprise same material.

* * * * *